United States Patent
Hwang et al.

(10) Patent No.: US 8,102,338 B2
(45) Date of Patent: Jan. 24, 2012

(54) ORGANIC LIGHT EMITTING DIODE DISPLAY AND METHOD FOR MANUFACTURING THE SAME

(75) Inventors: Young-In Hwang, Yongin-si (KR); Baek-Woon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 901 days.

(21) Appl. No.: 12/112,684

(22) Filed: Apr. 30, 2008

(65) Prior Publication Data

US 2009/0115706 A1    May 7, 2009

(30) Foreign Application Priority Data

Nov. 5, 2007    (KR) .................. 10-2007-0112255

(51) Int. Cl.
*G09G 3/32* (2006.01)
*H01J 1/62* (2006.01)
*H01J 63/04* (2006.01)

(52) U.S. Cl. ............. 345/82; 345/83; 313/498; 313/506

(58) Field of Classification Search ............... 345/76–83; 313/498–512
See application file for complete search history.

(56) References Cited

U.S. PATENT DOCUMENTS

| 5,405,710 A | 4/1995 | Dodabalapur et al. |
| 7,129,634 B2 * | 10/2006 | Boroson et al. .............. 313/504 |
| 2006/0158403 A1 * | 7/2006 | Kuma ............................ 345/83 |
| 2008/0203898 A1 * | 8/2008 | Kobayashi ................... 313/498 |

FOREIGN PATENT DOCUMENTS

| JP | 2006-236947 | 9/2006 |
| JP | 2007-035579 | 2/2007 |
| KR | 1020050095099 A | 9/2005 |

* cited by examiner

*Primary Examiner* — Bipin Shalwala
*Assistant Examiner* — Ryan A Lubit
(74) *Attorney, Agent, or Firm* — Cantor Colburn LLP

(57) ABSTRACT

An organic light emitting device including a first pixel, a second pixel and a third pixel displaying different colors from each other according to the present invention, the organic light emitting device includes a reflecting electrode and a translucent member forming a micro-cavity along with the reflecting electrode, wherein a optical path length is an interval between the reflecting electrode and the translucent member, and wherein the light path lengths of at least two pixels among the first pixel, the second pixel and the third pixel are the same.

16 Claims, 9 Drawing Sheets

FIG.2

| B | W | B | W | B |
|---|---|---|---|---|
| G | R | G | R | G |
| B | W | B | W | B |
| G | R | G | R | G |
| B | W | B | W | B |

ORGANIC LIGHT EMITTING DIODE DISPLAY AND METHOD FOR MANUFACTURING THE SAME

This application claims priority to Korean Patent Application No. 10-2007-0112255, filed on Nov. 5, 2008, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting diode display and a manufacturing method thereof.

(b) Description of the Related Art

Recent trends toward lightweight and thin personal computers and televisions sets have increased the desire for lightweight and thin display devices associated therewith. Flat panel displays, such as a liquid crystal display ("LCD") satisfying such requirements, are being substituted for conventional cathode ray tubes ("CRTs").

However, because the LCD is a passive display device, an additional back-light as a light source is needed. In addition, the LCD has additional drawbacks such as a slow response time and a narrow viewing angle.

Among the flat panel displays, an organic light emitting diode ("OLED") display has recently been the most promising as a display device for solving these drawbacks associated with other flat panel displays.

The OLED display includes two electrodes and an organic light emitting layer interposed between the two electrodes. One of the two electrodes injects holes and the other electrode injects electrons into the organic light emitting layer. The injected electrons and holes are recombined to form excitons, which emit light as release energy.

Because the OLED display is a self-emissive display device, an additional light source is not necessary such that the OLED display has lower power consumption, as well as a high response speed, wide viewing angle and high contrast ratio.

On the other hand, the OLED display includes a plurality of pixels such as red pixels, blue pixels and green pixels, and images of full colors may be displayed by selectively combining these pixels.

However, the OLED display has different light emitting efficiency according to light emitting materials. That is, a material having low light emitting efficiency among red, green and blue cannot represent the colors of a desired color coordinate, and it is also difficult to display a desired white color due to the material having the low light emitting efficiency in the case of emitting white color by combining red, green and blue.

To improve the light emitting efficiency, a micro-cavity may be used.

In a micro-cavity, light is repeatedly reflected between a reflection layer and a translucent layer in which both layers are separated by a predetermined distance (e.g., an optical path length) such that a strong interference effect is generated in the light. Accordingly, light of a specific wavelength is constructive, and light of remaining wavelengths is destructive.

Accordingly, the luminance and the color reproducibility may be simultaneously improved at the front side.

However, to represent full colors by using the micro-cavity, the red pixel, green pixel and blue pixel must have different optical path lengths corresponding to the wavelengths of each pixel. To form the different optical path lengths for each pixel, additional processing steps are required to form the micro-cavities for each pixel are required, thus increasing the number of total manufacturing processes.

BRIEF SUMMARY OF THE INVENTION

An aspect, feature and advantage provided by exemplary embodiments of the present invention include simplification of the processes for forming the micro-cavity as well as to improvement of the luminance and color reproducibility by using the micro-cavity.

An OLED display according to an exemplary embodiment of the present invention includes a first pixel, a second pixel, and a third pixel displaying different colors from each other, and each pixel includes a reflecting electrode and a translucent member forming a micro-cavity along with the reflecting electrode. An optical path length is a gap between the reflecting electrode and the translucent member, and the optical path lengths of at least two pixels among the first pixel, the second pixel and the third pixel are the same.

The OLED display may further include a transparent member disposed between the reflecting electrode and the translucent member, and the transparent member may be formed in a portion of at least one pixel among the first pixel, the second pixel and the third pixel.

The translucent member may include silver or aluminum, and the transparent member may include ITO or IZO.

The optical path lengths of the first pixel and the second pixel may be the same, and the transparent member may be formed in the third pixel and not in the first pixel and the second pixel.

The first pixel may be a red pixel, the second pixel may be a blue pixel, and the third pixel may be a green pixel.

The optical path lengths $L_1$ of the first pixel and the second pixel may satisfy $L_1 \approx m\lambda_1/2 \approx (m+1)\lambda_2/2$ and the optical path length $L_2$ of the third pixel may satisfy $L_2 \approx (m+1)\lambda_3/2$, where m is a natural number, $\lambda_1$ is a wavelength of the red region, $\lambda_2$ is a wavelength of the blue region, and $\lambda_3$ is a wavelength of the green region.

The optical path lengths of the first pixel and the second pixel may be the same, and the transparent member may be formed in the first pixel and the second pixel and not in the third pixel.

The first pixel may be a green pixel, the second pixel may be a blue pixel, and the third pixel may be a red pixel.

The optical path length $L_2$ of the third pixel may satisfy $L_2 \approx m\lambda_3/2$ and the optical path length $L_1$ of the first pixel and the second pixel may satisfy $L_1 \approx (m+1)\lambda_1/2 \approx (m+2)\lambda_2/2$, where m is a natural number, $\lambda_1$ is a wavelength of the green region, $\lambda_2$ is a wavelength of the blue region, and $\lambda_3$ is a wavelength of the red region.

The OLED display may further include a transparent electrode formed under the translucent member.

The translucent member may include a plurality of layers, wherein the layers include a first layer and a second layer which are alternately deposited and have different refractive indexes, and at least one layer among the plurality of layers may be formed only in some pixels among the first pixel, the second pixel and the third pixel.

The optical path lengths of the first pixel and the second pixel may be the same, and the at least one layer may be formed in the third pixel and not in the first pixel and the second pixel.

The first pixel may be the red pixel, the second pixel may be the blue pixel, and the third pixel may be the green pixel.

The optical path lengths $L_1$ of the first pixel and the second pixel may satisfy $L_1 \approx m\lambda_1/2 \approx (m+1)\lambda_2/2$ and the optical path length $L_2$ of the third pixel satisfies $L_2 \approx (m+1)\lambda_3/2$, where m is a natural number, $\lambda_1$ is a wavelength of the red region, $\lambda_2$ is a wavelength of the blue region, and $\lambda_3$ is a wavelength of the green region.

The optical path lengths of the first pixel and the second pixel may be the same, and the at least one layer may be formed in the first pixel and the second pixel and not in the third pixel.

The first pixel may be the red pixel, the second pixel may be the blue pixel, and the third pixel may be the green pixel.

The optical path lengths $L_1$ of the first pixel and the second pixel may satisfy $L_1 \approx m\lambda_1/2 \approx (m+1)\lambda_2/2$ and the optical path length $L_2$ of the third pixel may satisfy $L_2 \approx m\lambda_3/2$, where m is a natural number, $\lambda_1$ is a wavelength of the red region, $\lambda_2$ is a wavelength of the blue region, and $\lambda_3$ is a wavelength of the green region.

The OLED display may further include a white pixel, and the translucent member may be absent in the white pixel.

The OLED display may further include a thin film transistor, and a passivation layer formed on the thin film transistor, and the passivation layer film may be absent in the white pixel.

The first pixel, the second pixel, and the third pixel may respectively include a corresponding color filter.

The OLED display may further include an emission member disposed between the reflecting electrode and the translucent member, the emission member may include a plurality of sub-emission layers emitting light of different wavelengths, and the emission member emits white light by combining the light of the different wavelengths.

A method of manufacturing an OLED display including a plurality of pixels displaying different colors from each other according to the present invention includes forming a translucent member, forming a reflecting electrode, depositing a transparent conductive layer between the translucent member and the reflecting electrode, and photo-etching the transparent conductive layer, wherein the transparent conductive layer is maintained in some of the pixels and is removed in remaining pixels by the photo-etching.

A method of manufacturing an OLED display including a plurality of pixels displaying different colors from each other according to another exemplary embodiment of the present invention includes forming a reflecting electrode, forming an emission member under or on the reflecting electrode, forming a plurality of translucent layers wherein a first layer and a second layer having different refractive indexes are alternately deposited to form the translucent layers, and photo-etching a portion of the layers among the plurality of translucent layers, wherein the translucent layers are maintained in some pixels and are removed in remaining pixels by the photo-etching.

The first layer may be made of a silicon nitride layer and the second layer may be made of a silicon oxide layer, the silicon nitride layer may be etched by using $CF_4$ and $O_2$, and the silicon oxide layer may be etched by using $C_4F_8$ and $H_2$.

The OLED display may further include a white pixel of the plurality of pixels, and before forming the translucent layer, the method may further include forming a passivation layer and removing the passivation layer in the white pixel.

In an exemplary embodiment of the present invention, the color reproducibility and luminance may be improved by using the micro-cavity. Further, at least two pixels among the plurality of pixels displaying the different colors from each other have the same optical path lengths such that the number of processes for forming the different optical path lengths for each pixel may be reduced.

BRIEF DESCRIPTION OF THE DRAWINGS

FIG. 2 is a schematic diagram showing an arrangement of a plurality of pixels in the OLED display according to an exemplary embodiment of the present invention;

DETAILED DESCRIPTION OF THE INVENTION

Figure 1:
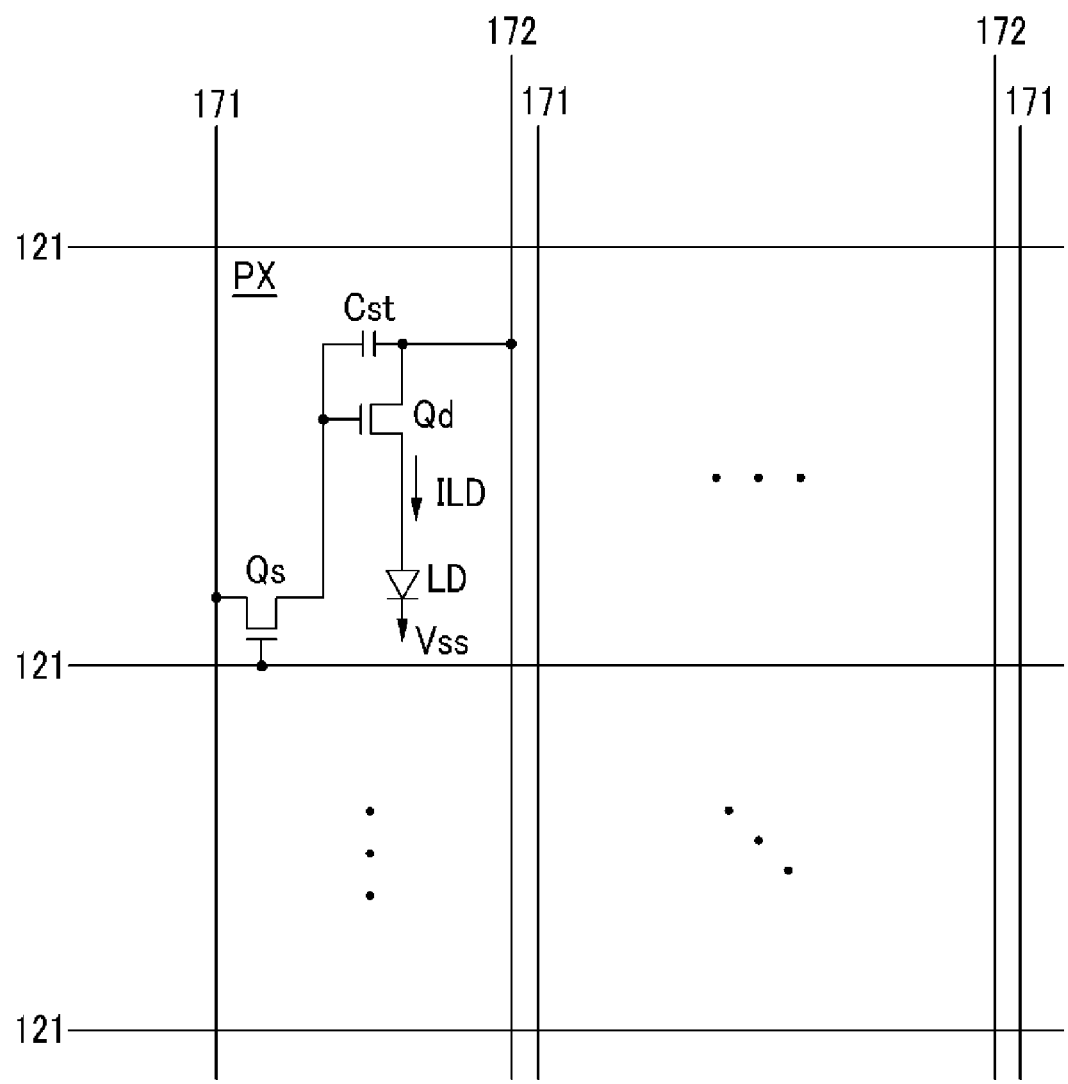
FIG. 1 is an equivalent circuit schematic diagram of an OLED display according to an exemplary embodiment of the present invention.

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Now, an OLED display according to an exemplary embodiment of the present invention will be described in further detail with reference to FIG. 1.

FIG. 1 is an equivalent circuit schematic diagram of an OLED display according to an exemplary embodiment of the present invention.

Referring to FIG. 1, the OLED display according to the present exemplary embodiment includes a plurality of signal lines 121, 171 and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 and the driving voltage lines 172 extend substantially in a column direction and substantially parallel to each other, as illustrated in FIG. 1.

Each pixel PX includes a switching transistor Qs, a driving transistor Qd, a capacitor Cst and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting diode LD. The driving transistor Qd drives an output current $I_{LD}$ having a magnitude depending on the voltage between the control terminal and the output terminal thereof, and outputs the output current $I_{LD}$ to the organic light emitting diode LD.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage Vss. The organic light emitting diode LD emits light having an intensity depending on the output current $I_{LD}$ of the driving transistor Qd, thereby displaying images.

The switching transistor Qs and the driving transistor Qd are n-channel field effect transistors ("FETs"). However, at least one of the switching transistor Qs and the driving transistor Qd may be a p-channel FET. In addition, the connections among the transistors Qs and Qd, the capacitor Cst, and the organic light emitting diode LD may be modified in alternative exemplary embodiments.

Now, the structure of the OLED display will be described in further detail with reference to FIGS. 2 and 3 along with FIG. 1.

Figure 2:
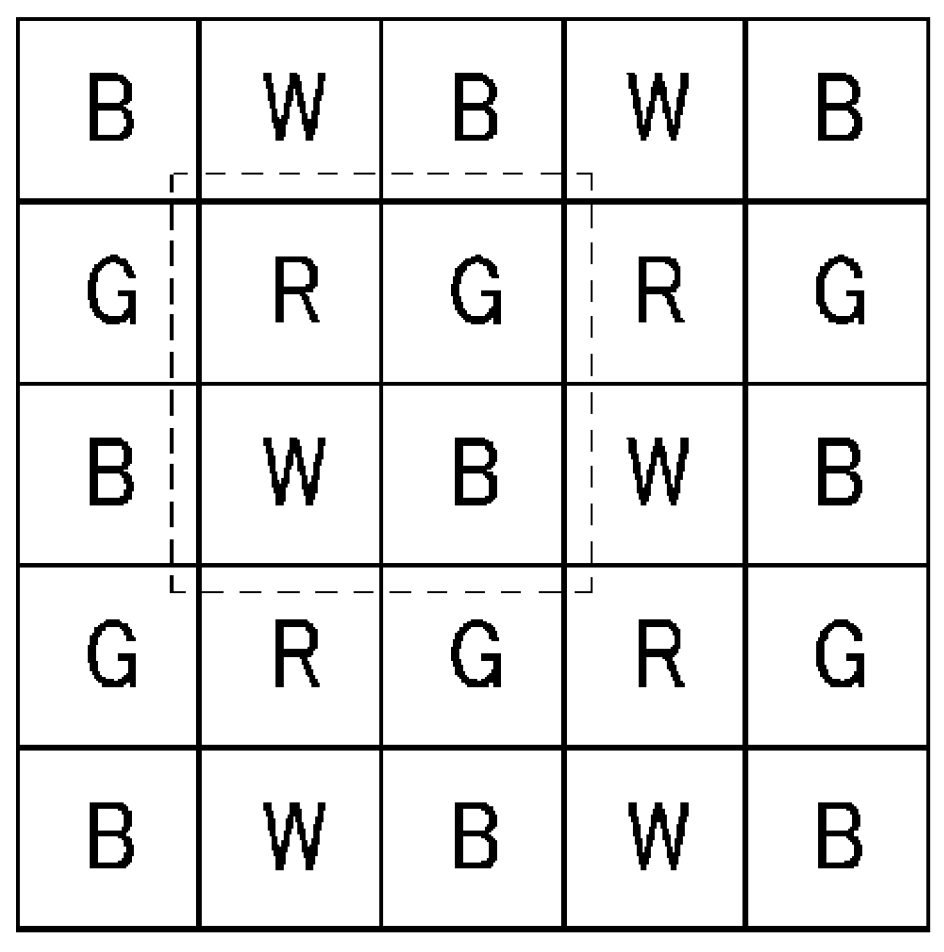

FIG. 2 is a schematic diagram showing an arrangement of a plurality of pixels in the OLED display according to an exemplary embodiment of the present invention. FIG. 3 is a cross-sectional view showing four neighboring pixels in the OLED display shown in FIG. 2.

Referring to FIG. 2, the OLED display according to an exemplary embodiment of the present invention includes red pixels R for displaying a red color, green pixels G for displaying a green color, blue pixels B for displaying a blue color and white pixels W for displaying a white color, which are sequentially and alternately disposed. The red pixels R, the green pixels G and the blue pixels B are basic pixels to display full colors, and the white pixels W are included to improve the luminance.

Four pixels of a red pixel R, a green pixel G, a blue pixel B and a white pixel W form one group, and may be repeatedly arranged according to rows and/or columns. However, the arrangement and the shape of the pixels may be variously changed in alternative exemplary embodiments.

Next, a more detailed structure of the OLED display of FIG. 2 will be described with reference to FIG. 3.

Figure 3:
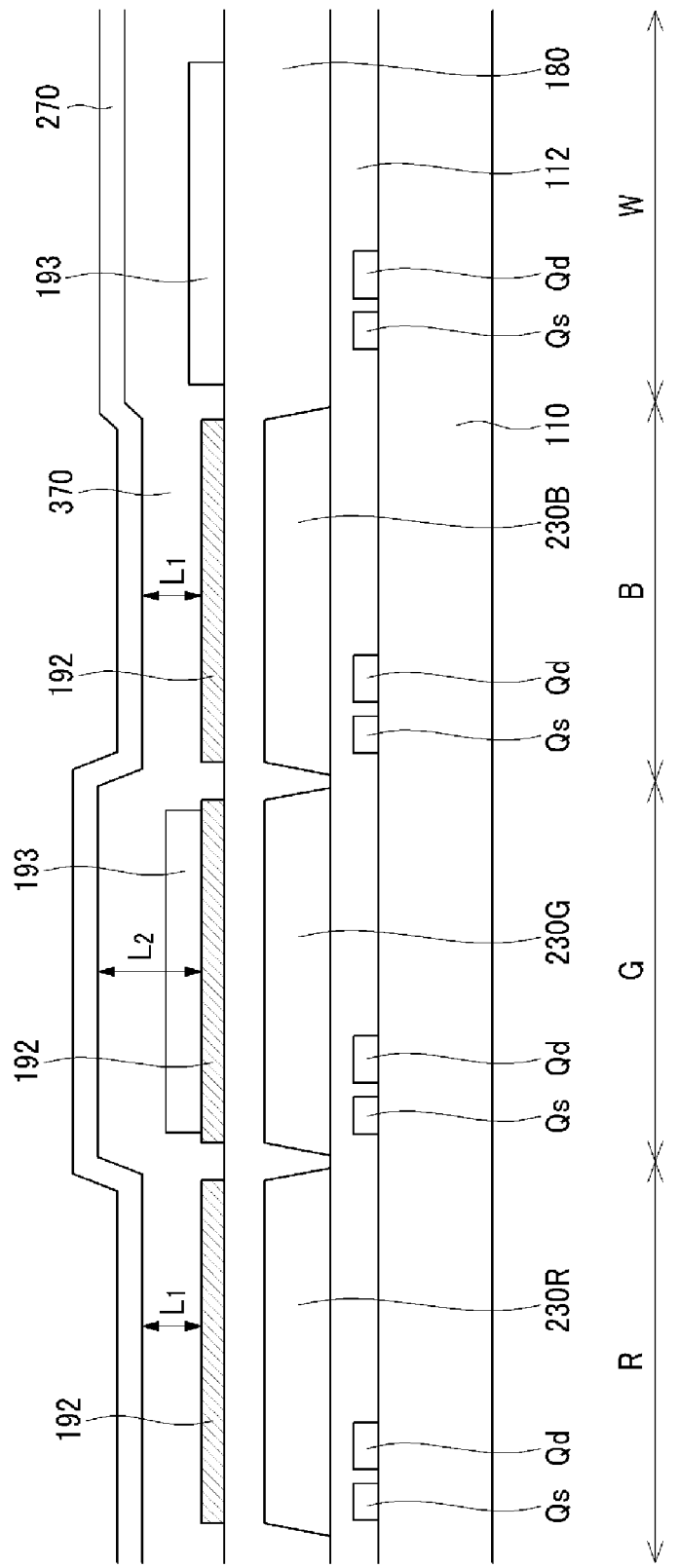
FIG. 3 is a cross-sectional view showing four neighboring pixels in the OLED display shown in FIG. 2.

In FIG. 3, one pixel group indicated by the dotted line of FIG. 2 and including a red pixel R, a green pixel G, a blue pixel B and a white pixel W in the OLED display shown in FIG. 2 is represented.

A plurality of thin film transistor arrays are arranged on an insulating substrate 110. The thin film transistor arrays include switching thin film transistors Qs and driving thin film transistors Qd which are disposed and electrically connected in each pixel.

A lower insulating layer 112 is formed on the thin film transistor arrays.

Red filters 230R, green filters 230G and blue filters 230B are formed in the red pixels, green pixels and blue pixels, respectively, on the lower insulating layer 112, and a color filter may not be formed or transparent filters (not shown) may be formed in the white pixels W. The color filters 230R, 230G and 230B may be disposed as a color filter on array ("CoA") type.

An upper insulating layer 180 is formed on the color filters 230R, 230G and 230B, and a translucent member 192 is formed on the insulating layer 180. The translucent member 192 is made of a material having characteristics such that a portion of light is transmitted and a portion of light is reflected. For example, the translucent member 193 may be formed of an opaque conductor having a low absorption ratio such as aluminum (Al) or silver (Ag) with a thickness of about 10 Å to about 100 Å. The translucent member 192 is not present in the white pixels W.

The translucent member 192 simultaneously functions as an anode electrode.

A plurality of transparent members 193 are formed on the translucent member 192 and the upper insulating layer 180, and the transparent members 193 are only arranged on some of the pixels and are not present on other pixels. In the present exemplary embodiment, the transparent members 193 are only disposed on the green pixels G and the white pixels W, and are not present on the red pixels R and the blue pixels B. The transparent members 193 disposed on the white pixels W function as the anode electrode.

The transparent members 193 may be made of a transparent conductor such as ITO or IZO.

A plurality of organic light emitting members are formed on the translucent member 192 and the transparent member 193.

The organic light emitting members may include an auxiliary layer (not shown) for improving light emitting efficiency of a light emission layer 370 as well as the light emission layer 370 for emitting light.

The emission layer 370 may include a plurality of sequentially deposited sub-emission layers emitting red, green and blue light, respectively, and may emit white light by combining the wavelengths of the red, green and blue light. Herein, the present invention is not limited to vertically forming the sub-emission layers, as the sub-emission layers may be horizontally formed. Also, the combination of light to emit the white light is not limited to red, green and blue color light. The sub-emission layers may be formed with various color combinations that emit the white light.

In addition, the auxiliary layer may include at least one selected from an electron transport layer (not shown), a hole transport layer (not shown), an electron injecting layer (not shown) and a hole injecting layer (not shown).

A common electrode 270 is formed on the organic light emitting members. In exemplary embodiments, the common electrode 270 is made of a material with a high reflection rate, and functions as a cathode electrode. The common electrode 270 is formed to cover the whole surface of the substrate 110, and forms a pair of electrodes with each translucent member 192 or transparent member 193 which function as the anode electrode to flow the current to the organic light emitting members 370.

In an exemplary embodiment of the present invention, the translucent member 192 generates a micro-cavity effect along with the common electrode 270. The micro-cavity effect occurs when light is repeatedly reflected between a reflection layer and translucent layers, which are spaced from each other by an optical path length such that light of a predetermined wavelength is enhanced by constructive interference. Here, the common electrode 270 functions as the reflection layer, and the translucent member 193 functions as the translucent layers.

The common electrode 270 modifies the light emitting characteristics of the light from the light emission layers 370, and light near a wavelength corresponding to the resonance wavelength of the micro-cavity among the modified light is enhanced through the translucent member 193 while light of different wavelengths is suppressed.

Here, the enhancement and the suppression of the predetermined wavelength may be determined according to the optical path length. The optical path length must satisfy the constructive interference condition for each wavelength according to the corresponding red, green and blue pixels.

Optical path lengths of at least two pixels among the red pixel R, the blue pixel B and the green pixel G are the same in an exemplary embodiment of the present invention.

For example, as shown in FIG. 3, the optical path lengths $L_1$ of the red pixel R and the blue pixel B are the same, and the optical path lengths $L_1$ may be determined as a value that simultaneously satisfies the constructive interference condition in the wavelength of the red region and the wavelength of the blue region, respectively.

The optical path length $L_1$ which simultaneously satisfies the constructive interference condition in the red pixel R and the blue pixel B may be represented as in Equation 1.

$$L_1 \approx m\lambda_1/2 \approx (m+1)\lambda_2/2 \qquad (1)$$

Here, m is a natural number, $\lambda_1$ is a wavelength of the red region, and $\lambda_2$ is a wavelength of the blue region. For example, it may be that m=1.

Optical path lengths of at least two pixels among the red pixel R, the blue pixel B and the green pixel G are the same such that the processes required for forming the different optical path lengths for each pixel may be reduced. That is, to form the different optical path lengths for each pixel, at least three photolithography processes to form the different thicknesses of the transparent members 193 disposed in each pixel are required or the emitting materials are respectively deposited in each pixel by using shadow masks to form the different thicknesses of the organic light emitting members including the emission layers 370. However, optical path lengths of at least two pixels among the red pixel R, the blue pixel B and the green pixel G are the same such that the number of required processes may be reduced.

On the other hand, the optical path length $L_2$ of the green pixel G is different from the optical path lengths $L_1$ of the red pixel R and the blue pixel B. That is, the optical path length $L_2$ of the green pixel G may be less than or more than the optical path lengths $L_1$ of the red pixel R and the blue pixel B. In FIG. 3, the optical path length $L_2$ of the green pixel G is more than the optical path lengths $L_1$ of the red pixel R and the blue pixel B.

When the optical path length $L_2$ of the green pixel G is more than the optical path lengths $L_1$ of the red pixel R and the blue pixel B, the optical path length $L_2$ of the green pixel G may be represented as in Equation 2.

$$L_2 \approx (m+1)\lambda_3/2 \qquad (2)$$

Here, m is a natural number and $\lambda_3$ is a wavelength of the green region.

Conversely, when the optical path length $L_2$ of the green pixel G is less than the optical path lengths $L_1$ of the red pixel R and the blue pixel B, the optical path length $L_2$ of the green pixel G may be represented as in Equation 3.

$$L_2 \approx m\lambda_3/2 \qquad (3)$$

Here, m is a natural number and $\lambda_3$ is a wavelength of the green region.

This optical path length may be controlled by the transparent member 193. In FIG. 3, the green pixel G has the transparent member 193 on the translucent member 192, and thus has a longer optical path length $L_2$. In contrast, the red pixel R and the blue pixel do not have the transparent member 193 and thus they have shorter optical path lengths $L_1$.

Because the white pixel W does not form the micro-cavity, it is not necessary to additionally control the optical path length thereof.

Figure 4:
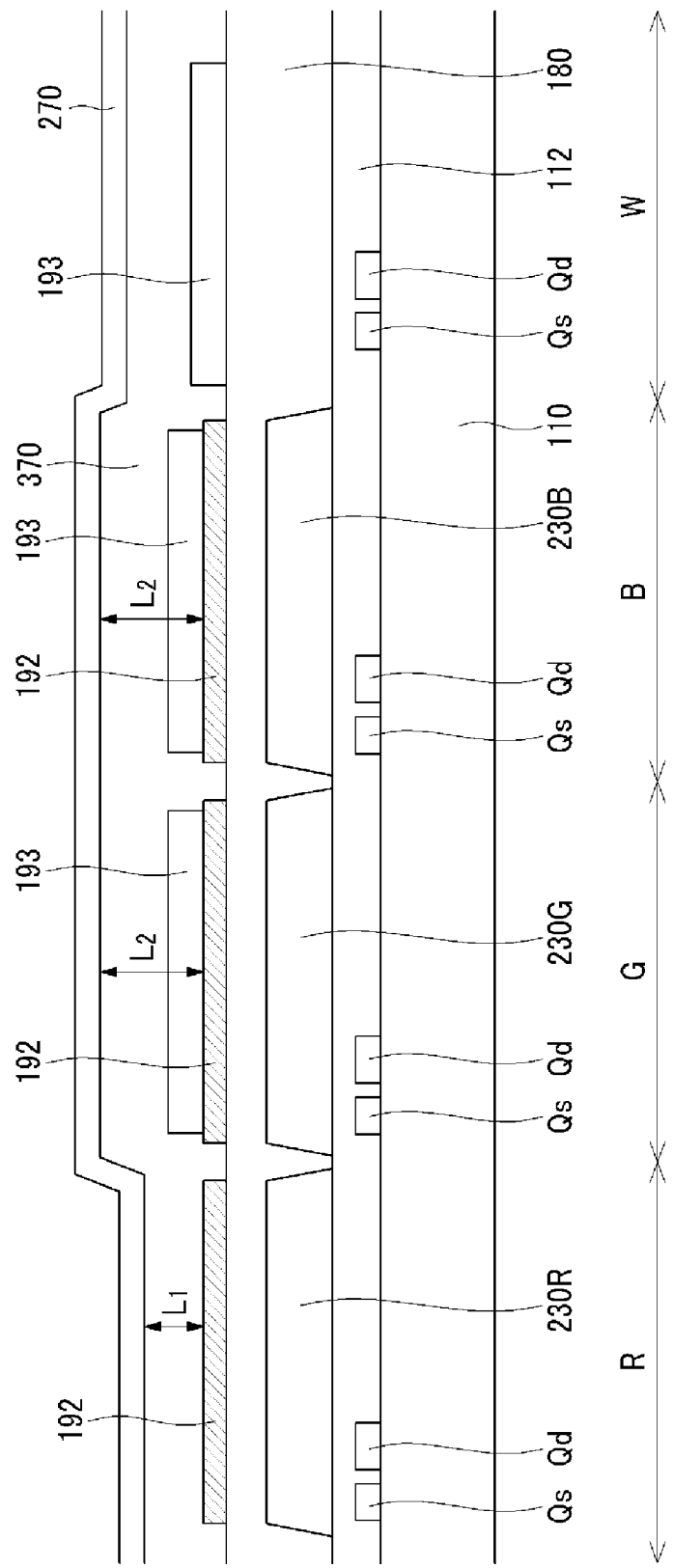
FIG. 4 is a cross-sectional view showing an OLED display according to another exemplary embodiment of the present invention.

FIG. 4 is a cross-sectional view of an OLED display according to another exemplary embodiment of the present invention.

Referring to FIG. 4, most of the constituent elements of the present exemplary embodiment are the same as those of the OLED display shown in FIG. 3, but the optical path lengths $L_2$ of the green pixel G and the blue pixel B are the same, and the optical path length $L_1$ of the red pixel R is different, contrary to the previously described exemplary embodiment.

The optical path length $L_1$ of the red pixel R may be less than or more than the optical path length $L_2$ of the green pixel G and the blue pixel B. FIG. 4 represents the case in which the optical path length $L_1$ of the red pixel R is less than the optical path length $L_2$ of the green pixel G and the blue pixel B.

The optical path length $L_1$ of the red pixel R may be represented as in Equation 4.

$$L_1 \approx m\lambda_1/2 \qquad (4)$$

Here, m is a natural number and $\lambda_1$ is a wavelength of the red region.

For example, it may be that m=1.

The optical path lengths $L_2$ of the green pixel G and the blue pixel B are determined as a value which simultaneously satisfies the constructive interference condition in the wavelength of the green region and the wavelength of the blue region, and may be represented as in Equation 5.

$$L_2 \approx (m+1)\lambda_2/2 \approx (m+2)\lambda_3/2 \qquad (5)$$

Here, m is a natural number, $\lambda_2$ is a wavelength of the green region, and $\lambda_3$ is a wavelength of the blue region.

The optical path length may be controlled by the transparent member 193. The transparent members 193 are only formed in the green pixel G and the blue pixel B and are not present in the red pixel R, so that the green pixel G and the blue pixel B have long optical path lengths and the red pixel R has a short optical path length. Because the white pixel W does not form the micro-cavity, it is not necessary to additionally control the optical path length thereof.

The emission characteristics of the OLED display according to the above-described exemplary embodiment will be described in further detail with reference to FIGS. 8 and 9.

Figure 8:
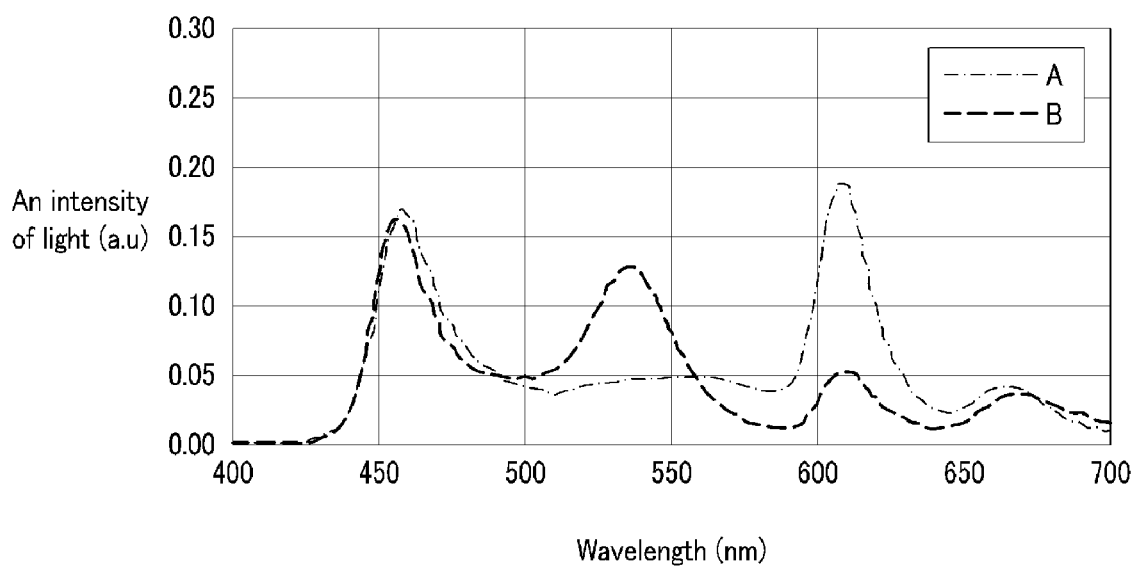
FIG. 8 is a graph showing red, green, and blue light spectrums and a white light spectrum in the OLED display according to the present exemplary embodiment.

FIG. 8 is a graph showing red, green, and blue light spectrums and a white light spectrum in the OLED display according to the present exemplary embodiment. FIG. 9 is a graph showing an increased or decreased ratio of the intensity of the light spectrum by the micro-cavity in the graph shown in FIG. 8 compared with the intensity of white light spectrum in the predetermined wavelength.

Figure 9:
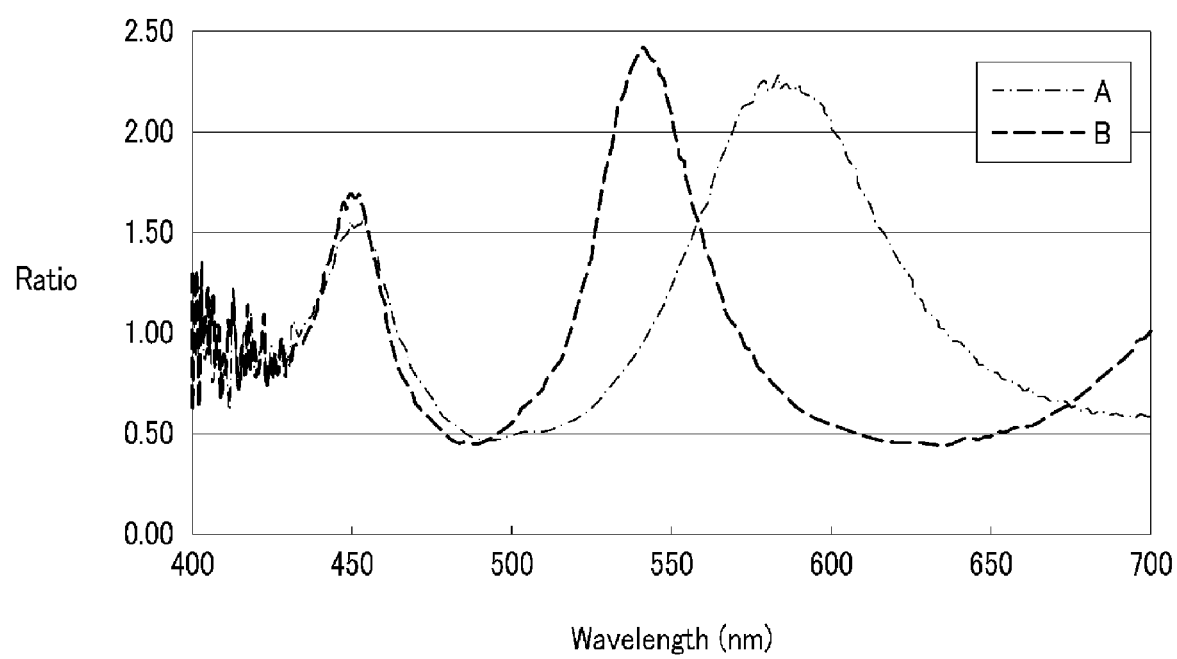
FIG. 9 is a graph showing an increased and decreased ratio of the intensity of the light spectrum by the micro-cavity in the graph shown in FIG. 8 compared with the intensity of a white light spectrum in the predetermined wavelength.

In FIGS. 8 and 9, "A" is a light spectrum of the micro-cavity condition according to the first exemplary embodiment as in FIG. 3, that is, in the case in which the optical path lengths of the red pixel R and the blue pixel B are the same, the peaks appear at the red wavelength region at about 610 nm and at the blue wavelength region at about 460 nm.

"B" is a light spectrum of the micro-cavity condition according to the second exemplary embodiment as in FIG. 4, that is, in the case in which the optical path lengths of the green pixel G and the blue pixel B are the same, and the peaks appear at the green wavelength region at about 540 nm and at the blue wavelength region at about 460 nm.

As shown in the graphs, although the optical path lengths are controlled to be the same in two pixels among the red pixel R, the green pixel G and the blue pixel B, each pixel may display the red, green and blue pixels. Accordingly, the number of processes to form the different optical path lengths for each pixel may be reduced and the desired color may be displayed.

Figure 5:
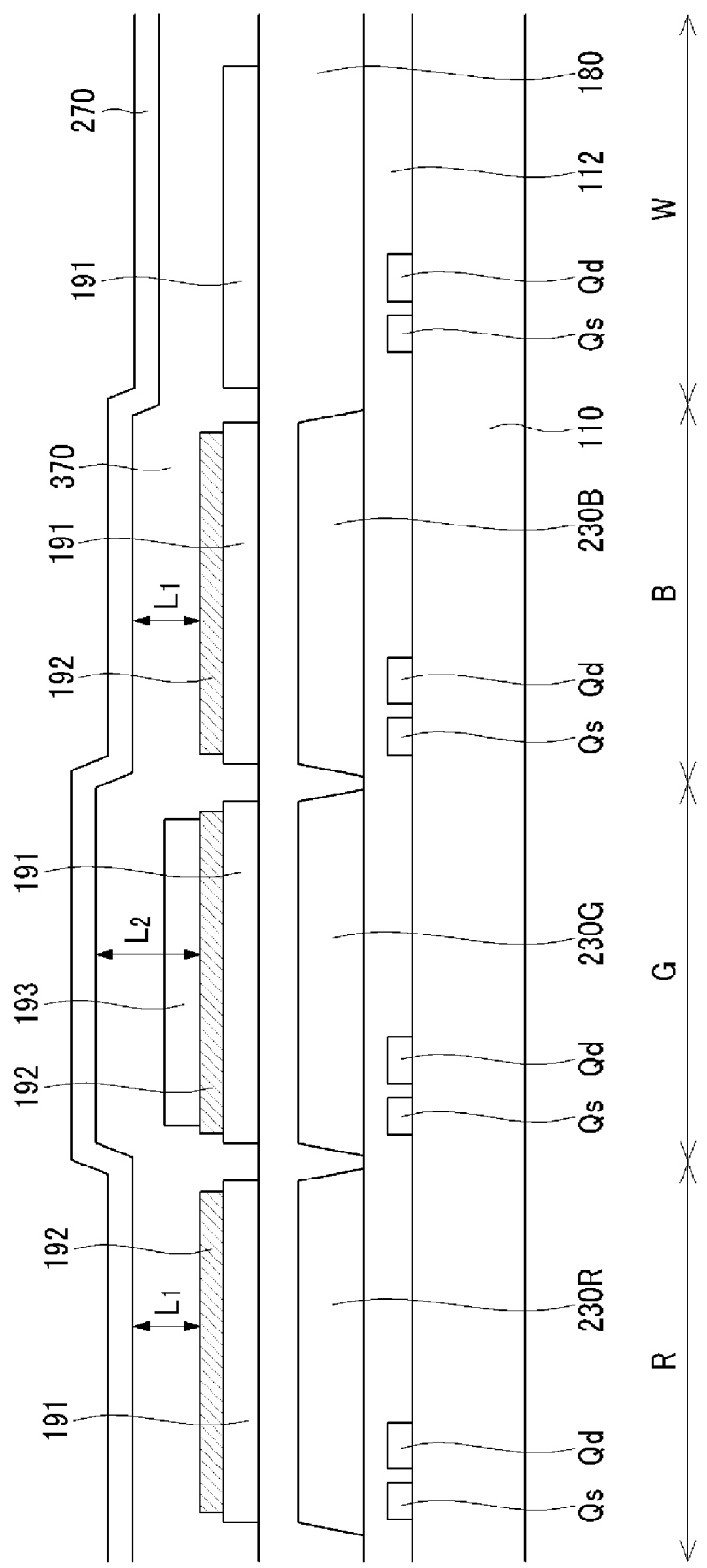
FIG. 5 is a cross-sectional view showing an OLED display according to another exemplary embodiment of the present invention.

FIG. 5 is a cross-sectional view of an OLED display according to yet another exemplary embodiment of the present invention.

Referring to FIG. 5, most of the constituent elements of the present exemplary embodiment are the same or almost the same as those of the OLED display shown in FIG. 3, but a transparent electrode 191 is formed under a translucent member 192 in each pixel, different from the above-described exemplary embodiment.

The transparent electrode 191 improves the adhesion between the translucent member 192 and the upper insulating layer 180. Particularly, the upper insulating layer 180 has contact holes (not shown) for connecting the driving thin film transistor Qd to an anode electrode, and when the translucent member 192 is directly formed on the contact holes, the thin film transistor and the anode electrode may be disconnected due to deterioration of the adhesion. The transparent electrode 191 may eliminate or effectively reduce this deterioration of the adhesion.

Now, other alternative exemplary embodiments of the present invention will be described in further detail with reference to FIGS. 6 and 7.

Figure 6:
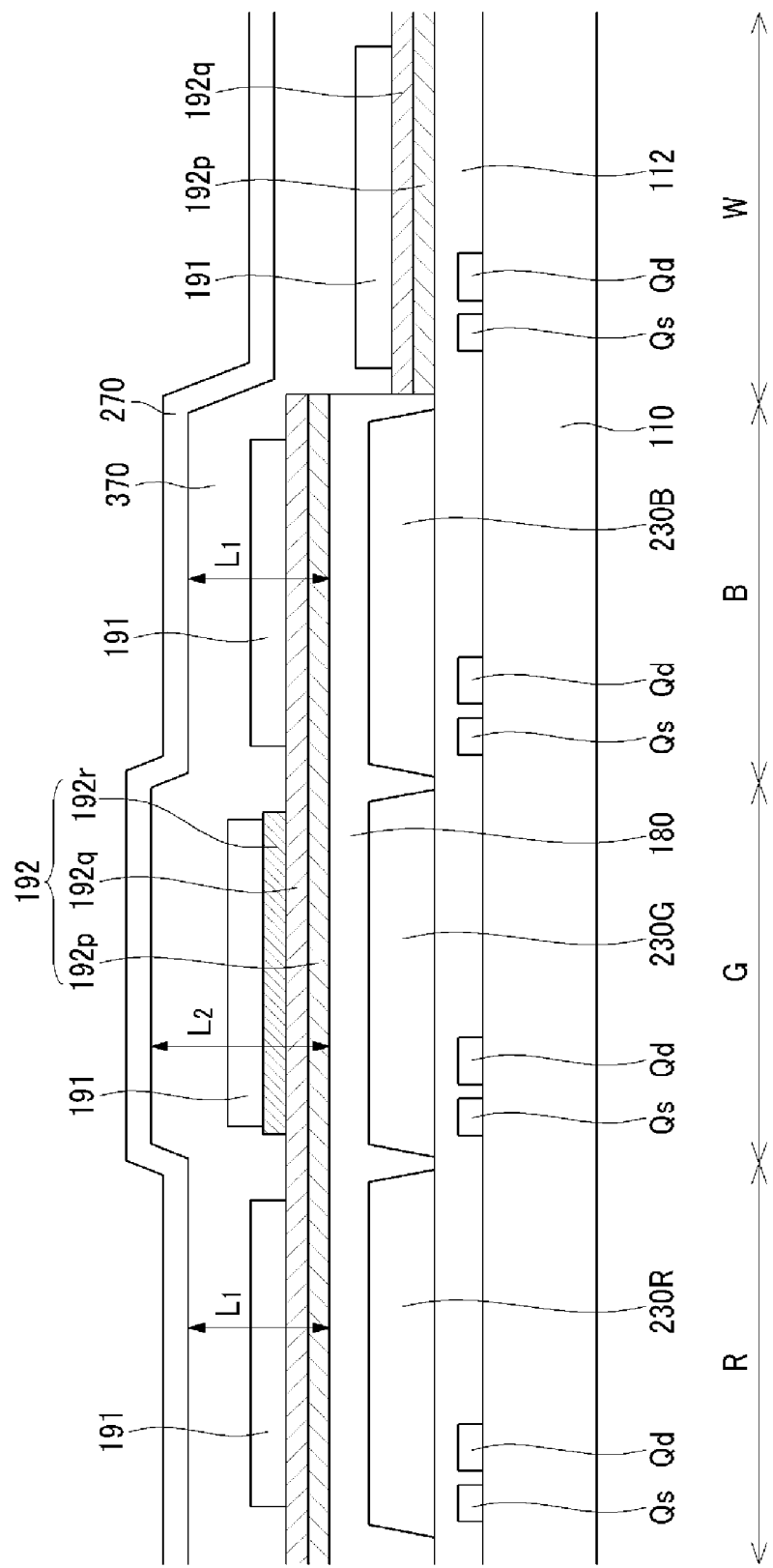
FIG. 6 and FIG. 7 are cross-sectional views showing an OLED display, respectively, according to alternative exemplary embodiments of the present invention.
Figure 7:
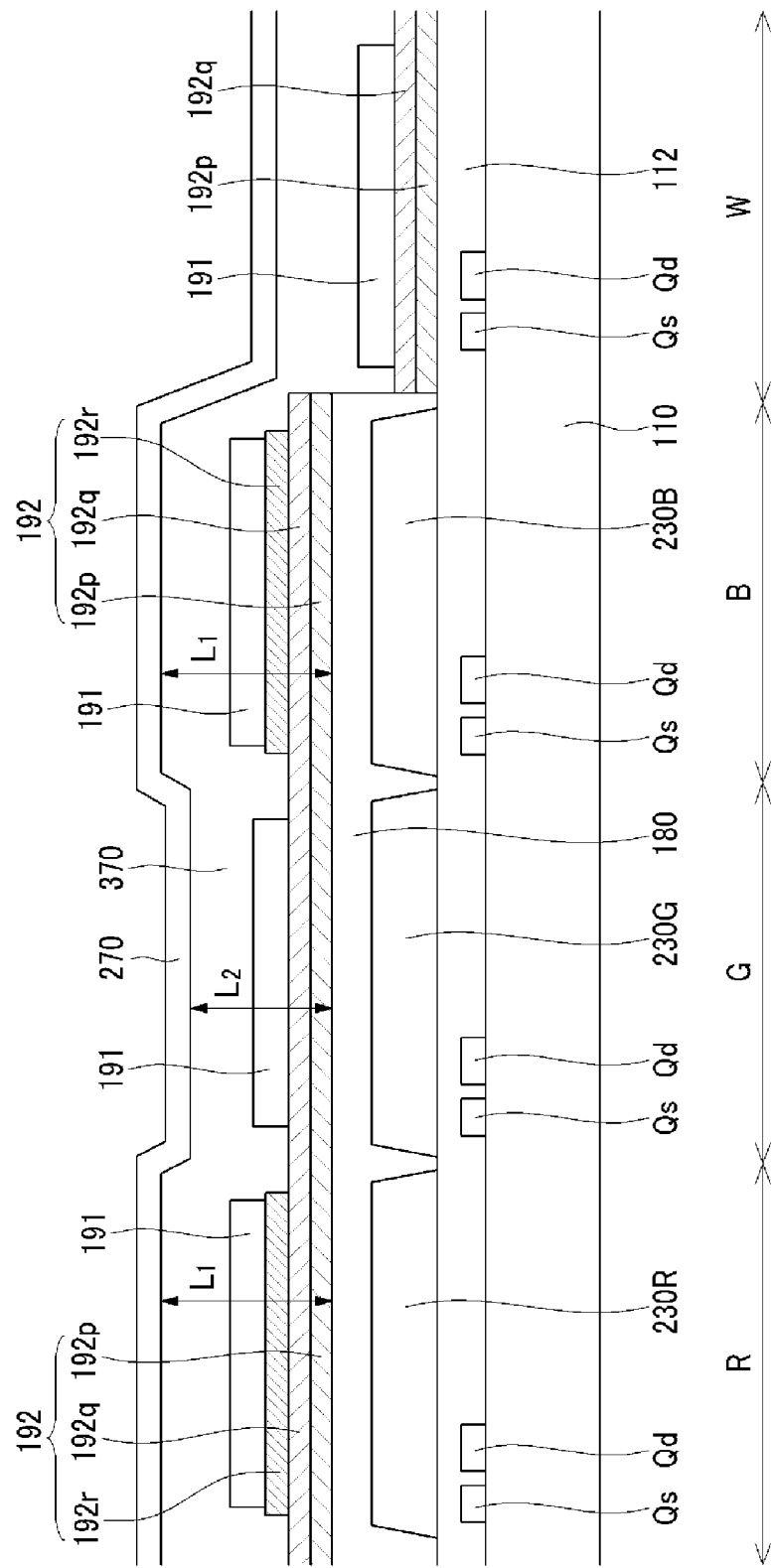

FIGS. 6 and 7 are cross-sectional views of OLED displays according to other alternative exemplary embodiments of the present invention.

In FIGS. 6 and 7, like the above-described exemplary embodiment, OLED displays include red pixels R, green pixels G, blue pixels B and white pixels W, and each pixel includes a switching thin film transistor Qs and a driving thin film transistor Qd which are electrically connected to each other.

A lower insulating layer 112 preferably made of silicon nitride is formed on the switching thin film transistor Qs and the driving thin film transistor Qd, and a red filter 230R, a green filter 230G and a blue filter 230B are formed in a red pixel R, a green pixel G and a blue pixel B, respectively, on the lower insulating layer 112.

An upper insulating layer 180 preferably made of an organic material is formed on the color filters 230R, 230G and 230B. The upper insulating layer 180 is not present in the white pixel W.

A translucent member 192 is formed on the upper insulating layer 180 and the lower insulating layer 112. The translucent member 192 has characteristics such that a portion of light is transmitted and a portion of light is reflected, and uses distributed Bragg reflection ("DBR") for controlling the reflection ratio of the specific wavelength.

The translucent member 192 includes a plurality of layers which are alternately deposited. In exemplary embodiments, the plurality of layers are made of inorganic materials having different refractive indexes. When the translucent member 192 is made of inorganic materials with a plurality of layers, a loss of light may be reduced under the transmitting or the reflection of the light compared with using a metal.

As shown FIGS. 6 and 7, the translucent member 192 includes a lower layer 192p, a middle layer 192q and an upper layer 192r.

In FIG. 6, the upper layer 192r is not present in the red pixel R and the blue pixel B, and the upper layer 192r is not present in green pixel G in FIG. 7. This is to control the optical path length in the red pixel R, the green pixel G and the blue pixel B, and will be described later.

The three-layered structure is represented in FIGS. 6 and 7, but the present invention is not limited thereto and the lower layer 192p and the upper layer 192q may be alternately deposited.

Here, the lower layer 192p and the upper layer 192r are made of the same material having a first refractive index, and the middle layer 192q is made of a material having a second refractive index. For example, the lower 192p and the upper layer 192r may be made of silicon nitride $SiN_x$ having a refractive index of about 1.8, and the middle layer 192q may be made of silicon oxide $SiO_2$ having a refractive index of about 1.5, but is not limited thereto.

A pixel electrode 191 is formed on the translucent member 192, and an emission layer 370 and a common electrode 270 are formed on the pixel electrode 191.

In the present exemplary embodiment, like the above-described exemplary embodiment, the optical path lengths of at least two pixels among the red pixel R, the blue pixel B and the green pixel G are the same. Here, the optical path length may be controlled by the upper layer 192r.

As shown in FIGS. 6 and 7, the optical path lengths $L_1$ of the red pixel R and the blue pixel B are the same in the present exemplary embodiment. The optical path length $L_1$ is determined as a value which simultaneously satisfies the constructive interference condition in the wavelengths of the red region and the blue region, and may be represented as in Equation 6.

$$L_1 \approx m\lambda_1/2 \approx (m+1)\lambda_2/2 \qquad (6)$$

Here, m is a natural number, $\lambda_1$ is a wavelength of the red region, and $\lambda_2$ is a wavelength of the blue region.

The optical path length $L_2$ of the green pixel G may be more than or less than the optical path lengths $L_1$ of the red pixel R and the blue pixel B. In FIG. 6, the optical path length $L_2$ of the green pixel G is more than the optical path lengths $L_1$ of the red pixel R and the blue pixel B. In FIG. 7, the optical path length $L_2$ of the green pixel G is less than the optical path lengths $L_1$ of the red pixel R and the blue pixel B.

In FIG. 6, when the optical path length $L_2$ of the green pixel G is more than the optical path lengths $L_1$ of the red pixel R and the blue pixel B, the optical path length $L_2$ of the green pixel G may be represented as in Equation 7.

$$L_2 \approx (m+1)\lambda_3/2 \qquad (7)$$

Here, m is a natural number and $\lambda_3$ is a wavelength of the green region.

In this case, because the upper layer 192r is only formed in the green pixel G in FIG. 6 and is not present in the red pixel R and the blue pixel B, the thickness of the upper layer 192p may control the optical path length $L_2$ of the green pixel G.

Conversely, as shown in FIG. 7, when the optical path length $L_2$ of the green pixel G is less than the optical path lengths $L_1$ of the red pixel R and the blue pixel B, the optical path length $L_2$ of the green pixel G may be represented as in Equation 8.

$$L_2 \approx m\lambda_3/2 \qquad (8)$$

Here, m is a natural number and $\lambda_3$ is a wavelength of the green region.

Here, because the upper layer 192r is only formed in the red pixel R and the blue pixel B and is not present in the green pixel G, the thickness of the upper layer 192r may control the optical path lengths $L_1$ of the red pixel R and the blue pixel B.

On the other hand, because the white pixel W includes the visible rays of all wavelengths, the micro-cavity amplifying the predetermined wavelength is not formed thereto.

In an exemplary embodiment of the present invention, the upper insulating layer 180 is removed in the white pixel W to remove the micro-cavity in the white pixel W. Accordingly, because the lower layer 192p made of silicon nitride is directly formed on the lower insulating layer 112 made of silicon nitride, the difference of the refractive index therebetween is not present such that the reflection and the interference are not generated. Also, because the upper layer 192r is also removed, the middle layer 192q is made of silicon oxide such that the micro-cavity may not be formed. Accordingly, the white light emitted from the emission layer 370 is not affected by a micro-cavity in the white pixel W and is emitted as it is.

In the present exemplary embodiment, the upper layer 192r in a portion of the pixels is removed such that the optical path length may be controlled. Because the removal of the upper layer 192r requires one photolithography process, the process may be simplified in comparison with the several photolithography processes to form the different optical path lengths in the red pixel R, the blue pixel B and the green pixel G.

On the other hand, because the lower layer 192p, the middle layer 192q and the upper layer 192r are formed on the upper insulating layer 180 made of an organic material, it is preferable that they are formed by chemical vapor deposition ("CVD") at a relatively low temperature of less than about 200° C. Also, as above-described, silicon nitride, silicon oxide and silicon nitride are sequentially deposited to form the lower layer 192p, the middle layer 192q and the upper layer 192r, and when etching the silicon nitride an etch gas including $CF_4$ and $O_2$ is used and when etching the silicon oxide an etch gas including $C_4F_8$ and $H_2$ is used, for etch selectivity between the silicon nitride and the silicon oxide.

In the present exemplary embodiment, the optical path lengths of the red pixel R and the blue pixel B are the same and the optical path length of the green pixel G is different therefrom, but the present invention is not limited thereto, and it may be determined that the optical path lengths of at least two pixels among the red pixel R, the green pixel G and the blue pixel B are the same.

In the above-described exemplary embodiments, the emission layer 370 emits the white light, but this is not limiting, and a structure including a red emission layer, a green emission layer and a blue emission layer respectively formed in the red pixel R, the green pixel G and the blue pixel B may be identically adapted, and the color filters 230R, 230G and 230B disposed in each corresponding pixel may be omitted.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode (OLED) display comprising a first pixel, a second pixel and a third pixel displaying different colors from each other, the OLED display comprises:
   a substrate;
   a reflecting electrode on the substrate; and
   a translucent member forming a micro-cavity along with the reflecting electrode,
   wherein an optical path length is a gap between the reflecting electrode and the translucent member,
   wherein the first pixel is a red pixel, the second pixel is a blue pixel, and the third pixel is a green pixel, wherein optical path lengths of the first pixel and the second pixel are the same, and
where the optical path length of the first pixel is different from an optical path length of the third pixel.

2. The OLED display of claim 1, further comprising
a transparent member disposed between the reflecting electrode and the translucent member, and the transparent member is formed in a portion of at least one pixel among the first pixel, the second pixel and the third pixel.

3. The OLED display of claim 2, wherein
the translucent member includes silver or aluminum, and
the transparent member includes ITO or IZO.

4. The OLED display of claim 2, wherein
the transparent member is formed in the third pixel and not in the first pixel and the second pixel.

5. The OLED display of claim 4, wherein
the optical path lengths L1 of the first pixel and the second pixel satisfy $L1 \approx m\lambda 1/2 \approx (m+1)\lambda 2/2$ and
the optical path length L2 of the third pixel satisfies $L2 \approx (m+1)\lambda 3/2$,
where m is a natural number, λ1 is a wavelength of the red region, λ2 is a wavelength of the blue region, and λ3 is a wavelength of the green region.

6. The OLED display of claim 2, wherein
the optical path lengths of the first pixel and the second pixel are the same, and
the transparent member is formed in the first pixel and the second pixel and not in the third pixel.

7. The OLED display of claim 2, further comprising
a transparent electrode disposed between the translucent member and the substrate.

8. The OLED display of claim 1, wherein
the translucent member includes a plurality of layers, wherein the layers include a first layer and a second layer which are alternately deposited and have different refractive indexes, and
at least one layer among the plurality of layers is formed only in some pixels among the first pixel, the second pixel and the third pixel.

9. The OLED display of claim 8, wherein
the optical path lengths of the first pixel and the second pixel are the same, and
the at least one layer is formed in the third pixel and is not formed in the first pixel and the second pixel.

10. The OLED display of claim 9, wherein
the optical path lengths $L_1$ of the first pixel and the second pixel satisfy $L_1 \approx m\lambda_1/2 \approx (m+1)\lambda_2/2$ and
the optical path length $L_2$ of the third pixel satisfies $L_2 \approx (m+1)\lambda_3/2$,
where m is a natural number, $\lambda_1$ is a wavelength of the red region, $\lambda_2$ is a wavelength of the blue region, and $\lambda_3$ is a wavelength of the green region.

11. The OLED display of claim 8, wherein
the optical path lengths of the first pixel and the second pixel are the same, and
the at least one layer is formed in the first pixel and the second pixel and is not formed in the third pixel.

12. The OLED display of claim 11, wherein
the optical path lengths $L_1$ of the first pixel and the second pixel satisfy $L_1 \approx m\lambda_1/2 \approx (m+1)\lambda_2/2$ and
the optical path length $L_2$ of the third pixel satisfies $L_2 \approx m\lambda_3/2$,
where m is a natural number, $\lambda_1$ is a wavelength of the red region, $\lambda_2$ is a wavelength of the blue region, and $\lambda_3$ is a wavelength of the green region.

13. The OLED display of claim 1, further comprising
a white pixel,
wherein the translucent member is absent in the white pixel.

14. The OLED display of claim 13, further comprising:
a thin film transistor; and
a passivation layer formed on the thin film transistor,
wherein the passivation layer is absent in the white pixel.

15. The OLED display of claim 1, wherein
the first pixel, the second pixel and the third pixel include a corresponding color filter.

16. The OLED display of claim 15, further comprising
an emission layer disposed between the reflecting electrode and the translucent member, and the emission layer includes a plurality of sub-emission layers emitting light of different wavelengths and emits a white light by combining the light of the different wavelengths.

* * * * *